United States Patent [19]
Moinpour et al.

[11] Patent Number: 6,092,253
[45] Date of Patent: Jul. 25, 2000

[54] FLEXIBLE-LEAF SUBSTRATE EDGE CLEANING APPARATUS

[75] Inventors: Monsour Moinpour, Cupertino; Ilan Berman, Sunnyvale; Young C. Park, Mountain View, all of Calif.

[73] Assignee: Intel Corporation, Santa Clara, Calif.

[21] Appl. No.: 09/203,313

[22] Filed: Dec. 1, 1998

Related U.S. Application Data

[63] Continuation of application No. 08/777,521, Dec. 30, 1996, Pat. No. 5,901,399.

[51] Int. Cl.[7] .............................. B08B 11/02; A46B 13/04
[52] U.S. Cl. ................................ 15/77; 15/21.1; 15/88.3; 15/102
[58] Field of Search .............................. 15/21.1, 77, 88.2, 15/88.3, 102, 230.16

[56] References Cited

U.S. PATENT DOCUMENTS

| | | |
|---|---|---|
| 329,863 | 11/1885 | Straker . |
| 3,995,343 | 12/1976 | Horner . |
| 4,027,686 | 6/1977 | Shortes et al. . |
| 4,202,071 | 5/1980 | Scharpf . |
| 4,326,553 | 4/1982 | Hall . |
| 5,013,367 | 5/1991 | Butts . |
| 5,128,281 | 7/1992 | Dyer et al. . |
| 5,142,725 | 9/1992 | Hayes et al. . |
| 5,144,711 | 9/1992 | Gill, Jr. . |
| 5,148,569 | 9/1992 | Jailor et al. . |
| 5,350,428 | 9/1994 | Leroux et al. . |
| 5,351,360 | 10/1994 | Suzuki et al. . |
| 5,485,644 | 1/1996 | Shinbara et al. . |
| 5,595,522 | 1/1997 | Simpson et al. . |
| 5,651,160 | 7/1997 | Yonemizu et al. . |
| 5,937,469 | 8/1999 | Culkins et al. ........................ 15/77 |

FOREIGN PATENT DOCUMENTS

| | | |
|---|---|---|
| 2488157 | 12/1982 | France . |
| 2055153 | 11/1970 | Germany . |
| 0143634 | 12/1983 | Japan . |
| 60-143634 | 7/1985 | Japan . |
| 092003313 | 3/1992 | WIPO . |

*Primary Examiner*—Randall E. Chin
*Attorney, Agent, or Firm*—Blakely, Sokoloff, Taylor & Zafman LLP

[57] ABSTRACT

An apparatus for cleaning edges and/or bevel areas of substrates is described. In one embodiment, the present invention includes a core having a plurality of flexible leaves spaced along an external surface of the core. A motor is coupled to the core for rotating the core about an axis of rotation. The rotation of the core causes the flexible leaves to rotate such that the leaves extend outward to intermittently strike points along the edge and/or bevel areas of the wafer.

16 Claims, 5 Drawing Sheets

FIG. 2B
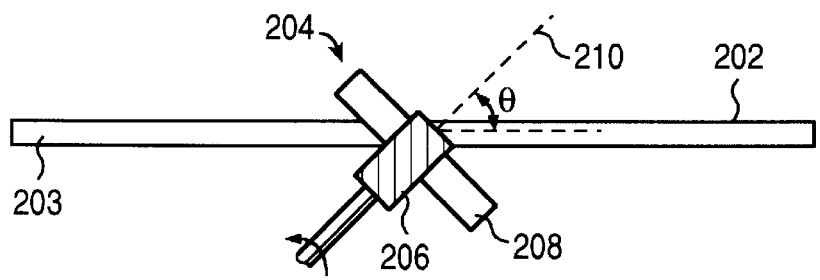
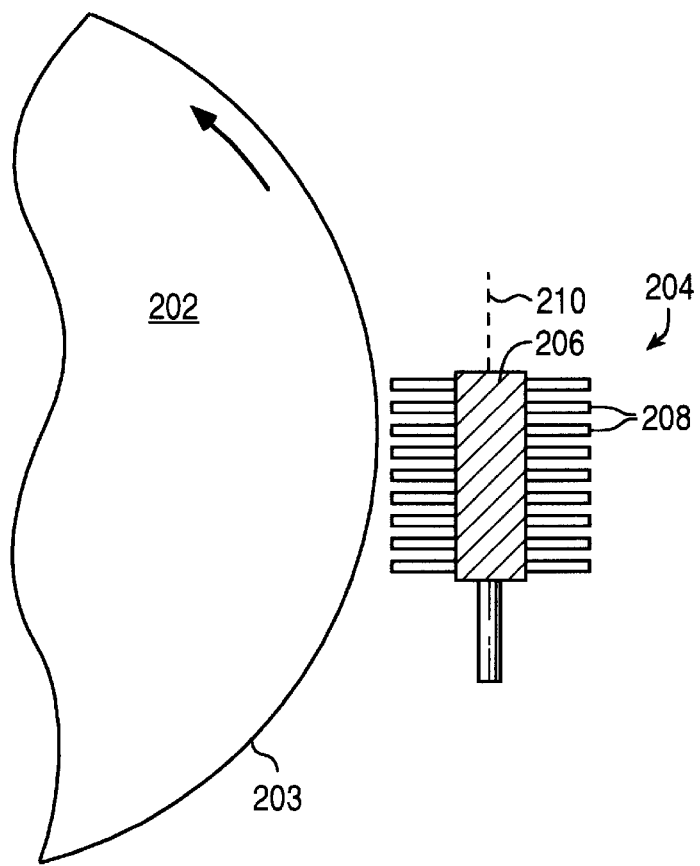
FIG. 2C

FLEXIBLE-LEAF SUBSTRATE EDGE CLEANING APPARATUS

A continuation application of U.S. patent application entitled "Flexible-Leaf Substrate Edge Cleaning Apparatus", Ser. No. 08/777,521, filed Dec. 30, 1996, now U.S. Pat. No. 5,901,399.

FIELD OF THE INVENTION

The present invention relates to the field of semiconductor substrate processing; more particularly, the present invention relates to cleaning the edges and/or bevel areas of semiconductor substrates.

BACKGROUND OF THE INVENTION

Semiconductor manufacturers use semiconductor wafers as the base for manufacturing integrated circuits. In one step of the manufacturing process, the wafers are put through chemical mechanical polishing (CMP). CMP is becoming the main planarization technology for both dielectric and metal layers. For the CMP of dielectric layers, such as BPSG, BPTEOS, and PECVD Oxides (often referred to as the ILD0, ILD1, ILD2 . . . layers, respectively), a fumed silica-based slurry is normally used. Other slurries, such as dispersed silica, fumed or dispersed allumina, are also being used for CMP of both oxides and metals (such as tungsten (W), copper (Cu), aluminum (Al), and titanium (Ti)). When the CMP process is completed, the wafers' surfaces are covered in particles, referred to as a slurry residue. At later steps in the process flow, some of this slurry residue is redistributed across the front of the wafer, thereby resulting in a loss in die yield and/or device performance. To prevent the slurry redistribution, all surfaces of a wafer must be free of contamination.

Different post CMP cleaning methods have been introduced in the last few years. These include cleaning the wafers in wet stations using conventional wet cleaning methods, such as SC1, HF and megasonic cleaning. Other cleaning methods in use are based on scrubbing wafers with brushes of various kinds and configurations using DI water or a combination of DI with chemicals such as Ammonia and Citric acid.

One system used to remove wafer contaminants is a double sided scrubber. In a double sided scrubber, a semiconductor wafer is scrubbed simultaneously on both sides by brushes. Since the wafer is being scrubbed simultaneously on both sides by the brushes, there must be a way of holding the wafer in place and rotating the wafer so the entire surface of the wafer is cleaned. A mechanism used for this purpose is commonly referred to as a roller.

Today, double sided scrubbers are usually automated and comprise a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof. FIG. 1 illustrates a conventional double sided wafer scrubber. Referring to FIG. 1, a wafer 102 is being scrubbed by brushes, one of which is shown as brush 110 and the other being beneath wafer 102 and directly below brush 110. Rollers 108 and 109 rotate wafer 102 so the entire wafer surface may be cleaned. Each of brushes 110 is rotated about its central axis by a motor 106. The rotary motion of rollers 108 is then transferred to wafer 102 when the edge of each of rollers 109 comes into contact with the outer edge of wafer 102.

Although conventional brush cleaning systems can effectively clean the front and backs of semiconductor substrates, such systems fail to provide a sufficient amount of mechanical energy at the edge/bevel to remove contamination.

The present invention provides an apparatus that cleans the edge of substrates, including the bevel area when present.

SUMMARY OF THE INVENTION

An apparatus for cleaning edges and/or bevel areas of substrates is described. In one embodiment, the present invention includes a core having a plurality of flexible leaves spaced along an external surface of the core. A motor is coupled to the core for rotating the core about an axis of rotation. The rotation of the core causes the flexible leaves to rotate such that the leaves extend outward to intermittently strike points along the edge and/or bevel areas of the wafer.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 2B illustrates a side-sectional view of the edge cleaning mechanism illustrated in FIG. 2A wherein the angle between the rotational axis of the cleaning mechanism is oblique in relation to the edge of the wafer.

FIG. 2C illustrates a side-sectional view of a flexible-leaf edge cleaning mechanism wherein the angle between the rotational axis of the cleaning mechanism is parallel to the edge of the wafer.

DETAILED DESCRIPTION

An apparatus for cleaning edges of contaminated substrates is described. The cleaning process may be used in double sided scrubber systems or other systems, such as, for instance, chemical mechanical polishing systems or flat panel display manufacturing systems. In the following description, numerous specific details are set forth such as rotation speeds, chemicals, pressures, etc., in order to provide a thorough understanding of the present invention. It will be apparent, however, to one skilled in the art that the present invention may be practiced without these specific details. In other instances, well-known components, structures and techniques have not been shown in detail in order to avoid obscuring the present invention.

The present invention provides a method and apparatus that cleans the edge of substrates, including the bevel area when present. In the present invention, particles are removed from the edge and/or bevel area (or any other surface sloping from the edge to the top or bottom of the substrate) using an edge scrubbing mechanism that may be incorporated into a scrubber tool.

Although the present invention is described in conjunction with the scrubbing of a wafer, it will be appreciated that any similarly shaped, i.e. generally flat, substrate, may be processed by the methods and apparatuses of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, two or multiple substrates bonded to each other, or substrates for processing other apparatuses and devices such as flat panel displays, multichip modules, etc.

Figure 1:
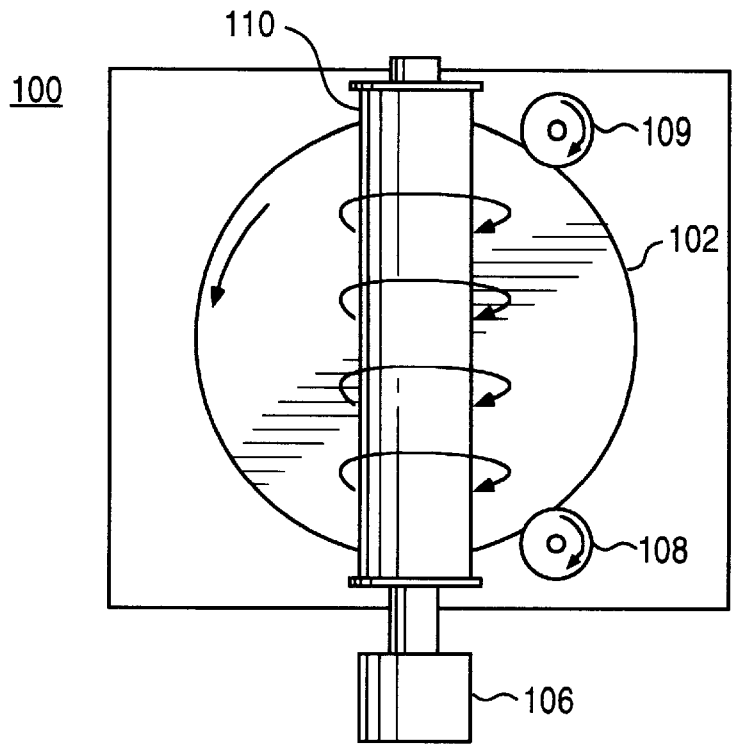
FIG. 1 illustrates a prior art double sided wafer scrubber.
Figure 2A:
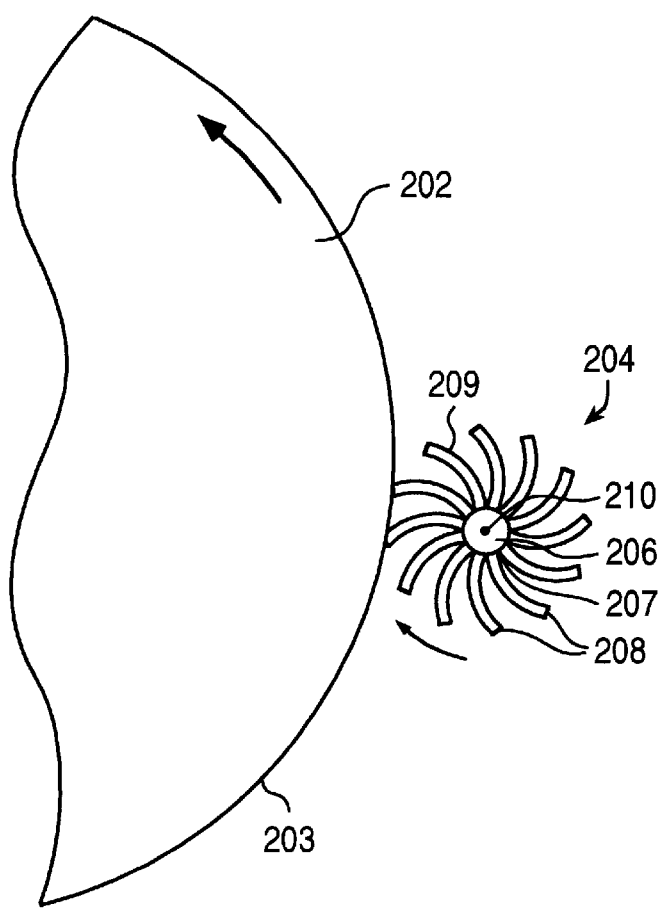
FIG. 2A illustrates a top view of a flexible-leaf edge cleaning mechanism in one embodiment of the present invention.

FIG. 2A illustrates a top view of a wafer edge cleaning mechanism 204 in one embodiment of the present invention. As shown, edge cleaning mechanism 204 comprises a core 206 having a plurality of flexible leaves 208 extending outward from an outer surface 207 of core 206. Core 206 is rotated in a clockwise direction about a first axis of rotation 210, the first axis of rotation being perpendicular to the surface of wafer 202. Particles are removed from the edge 203 of wafer 202 by rotating the wafer in a counter-clockwise direction about a second axis of rotation located at the center of the wafer and simultaneously rotating core 206 such that flexible leaves 208 strike the edge of the wafer. In accordance with the cleaning mechanism of FIG. 2A, particles are removed from the edge 203 of wafer 202 as a side surface 209 of flexible leaves 208 impinge against the wafer edge. The removal of contaminates from edge 203 is partially achieved by a transfer of kinetic energy from leaves 208 to the particle(s) being removed. The amount of energy transferred is dependent upon a number of factors including: (1) the velocity difference at the point of contact between leaves 208 and wafer edge 203; (2) the length and width of leaves 208; and (3) the distance between the outer surface 207 of core 206 and the edge 203 of wafer 202. The sweeping action of leaves 208 along the surface of edge 203 also causes particles to be dislodged from the edge due to friction between the particles and the side surface 209 of leaves 208. The width of side surface 209 and the texture of leaves 208 affect the amount of friction that is created at the edge 203 and leaves 208 interface.

With reference to FIG. 2B, the edge cleaning mechanism of FIG. 2A is shown wherein the axis of rotation 210 of core 206 is oriented at angle that is oblique to the edge 203 of wafer 202. As illustrated, the axis of rotation 210 of core 206 is oriented at an angle, theta, from an axis that is defined by the wafer's edge 203 which is also the direction of wafer travel. By orienting the axis of rotation 210 of core 206 in this manner, the contact area between edge 203 and leaves 208 is increased, thus enhancing the particle removal capability of edge cleaning mechanism 204. As shown in FIG. 2C, edge cleaning mechanism 204 may be aligned such that the axis of rotation 210 of core 206 is oriented parallel to the edge 203 of wafer 202. Moreover, it is important to note that core 206 may include a single row of leaves 208 as depicted in FIGS. 2A and 2B, or may include multiple rows of leaves 208 as shown in FIG. 2C.

In one embodiment, leaves 208 are made of Poly Vinyl Alcohol (PVA), nylon, polyurethane, or other abrasive materials. The length of leaves 208 may vary greatly depending upon the particular application and will depend primarily upon the distance between the outer surface 207 of core 206 and the edge 203 of wafer 202. In one embodiment, the distance between core 206 and edge 203 is adjustable. In such an embodiment, the amount of force exerted by leaves 208 onto the edge of the wafer may be adjusted by varying the relative position between core 206 and edge 203. In yet another embodiment, a variable speed motor may be used to provide rotational movement to core 206. In such an embodiment, the difference in velocity between edge cleaning apparatus 204 and wafer 202 may be varied by changing the rotational speed of core 206. The amount of force exerted by leaves 208 onto edge 203 may also be varied by adjusting the speed of edge cleaning apparatus motor.

Figure 3:
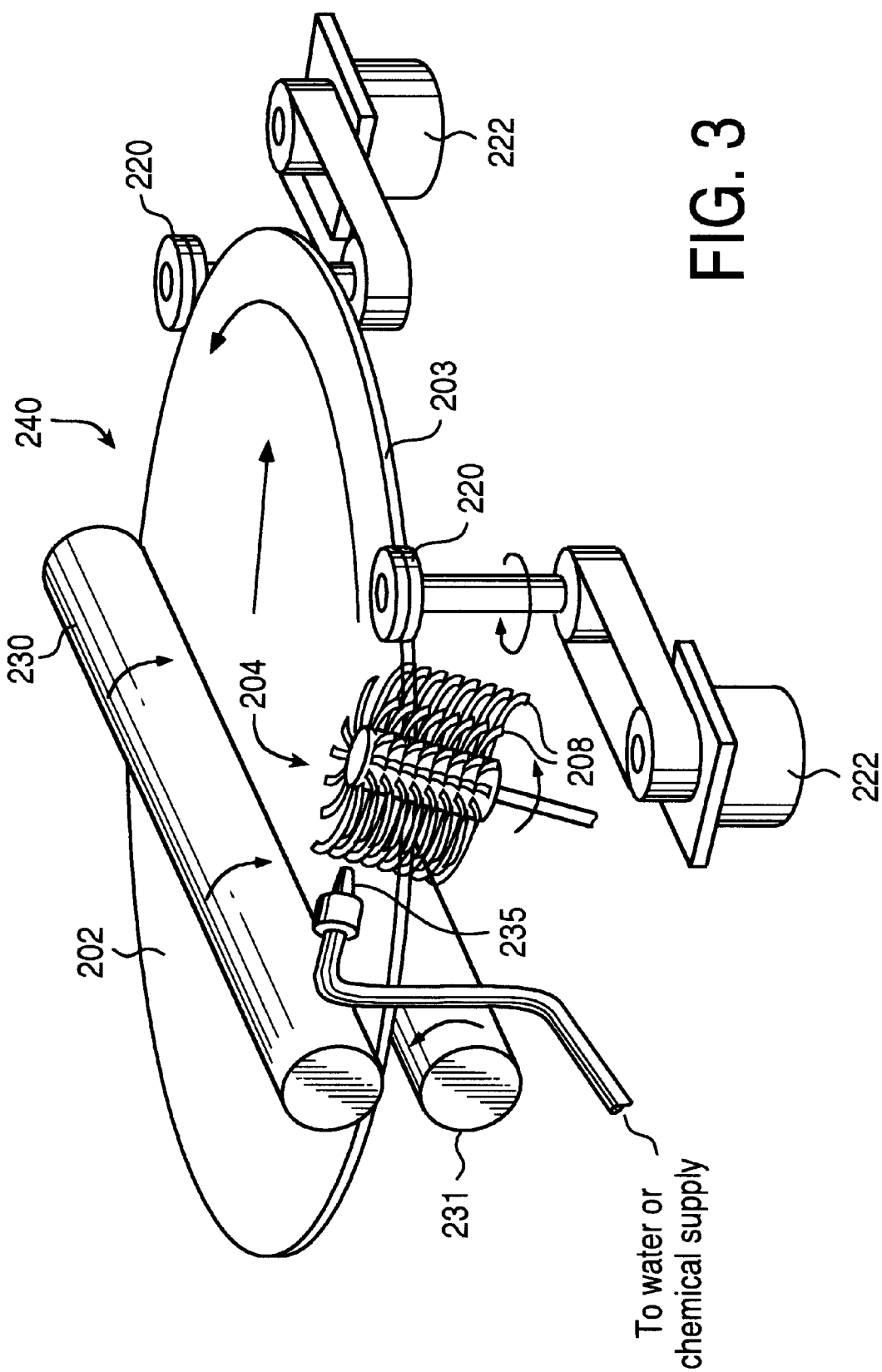
FIG. 3 illustrates a perspective view of an embodiment of the present invention wherein the flexible-leaf edge cleaning mechanism is incorporated into a double-sided scrubber.

Turning now to FIG. 3, edge cleaning apparatus 204 is shown incorporated into a double sided scrubber 240. As illustrated in FIG. 3, wafer 202 is cleaned by a top-side brush 230 and a bottom-side brush 231 as it moves through the scrubber (from left to right). Rollers 220 are provided to rotate wafer 202 in a counter-clockwise direction as indicated. Motors 222 are coupled to rollers 220 to provide rotational movement to the rollers. In one embodiment, edge cleaning apparatus 204 is provided along side wafer 202. As wafer 202 moves through scrubber 240, edge cleaning apparatus 204 is rotated such that leaves 208 impinge upon the edge 203 of the wafer. Hence, as wafer 202 moves through the double sided scrubber system, top-side and bottom-side brushes 230 and 231 clean the top and bottom surfaces of wafer 202, while edge cleaning apparatus 204 removes contaminates along the edge and bevel areas of the wafer. In one embodiment the wafer edge cleaning apparatus rotates at ±100 revolutions per minute.

One benefit of the present invention lies in the combined use of side brushes 230 and 231 and edge cleaning apparatus 204 to clean all of the exposed areas of the wafer which may be contaminated with slurry particles. This includes the top surface, bottom surface and the edge/bevel areas of the wafer. Another benefit of the present invention is that edge cleaning apparatus 204 may be integrated into current double-side scrubber mechanism with minimal design changes to the scrubber system. In addition, since the rotation of the edge cleaning apparatus is independent of the wafer rotation, the relative velocity of the edge cleaning apparatus may be varied without affecting the cleaning of the top-side and bottom-side surfaces of the wafer.

To further facilitate particle removal, a water jet 235 may be used to propel water into or near the point of contact between the leaves 208 of apparatus 204 and the wafer edge 203, as shown in FIG. 3. The water jet may be positioned such that the direction of water flows from a plane aligned with the rotational axis of the wafer and contact points between the wafer and the edge cleaning apparatus. In such a case, the water may simply carry the particles away that are removed from the wafer by the edge cleaning apparatus or may, if at sufficient pressure, cause removal of particles by itself. Note that the water jet is held in place by a support structure which is well-known in the art. In one embodiment, the water jet is held in place above the wafer. Such a jet may be as simple as a barbed coupling with reducing barb to increase the velocity of the created stream. In one embodiment, the barbed coupling is 1/8" to 1/16" in diameter. In another embodiment, the jet may include a nozzle that produces a fanned, knife edge pattern. Water jets are well-known in the art. Note also that jets that spray other chemicals may be used, instead of water, to facilitate particle removal. Jets can also be used to spray a mixture of water and other chemicals such as HF, $SC_2$, $NH_4OH$.

The edge cleaning apparatus leaves 208 may be cleaned occasionally to remove build-up of particles. In one embodiment, the scrubber may flow DI water or a combination of DI water and a chemical such as $NH_4OH$ or $NH_4OH/H_2O_2$ mixture through itself. In an alternate embodiment, the edge cleaning apparatus may be cleaned by spraying DI or a combination of DI and a chemical such as $NH_4OH$ or $NH_4OH/H_2O_2$ onto leaves 208 during wafer cleaning to reduce particle build-up.

Figure 4:
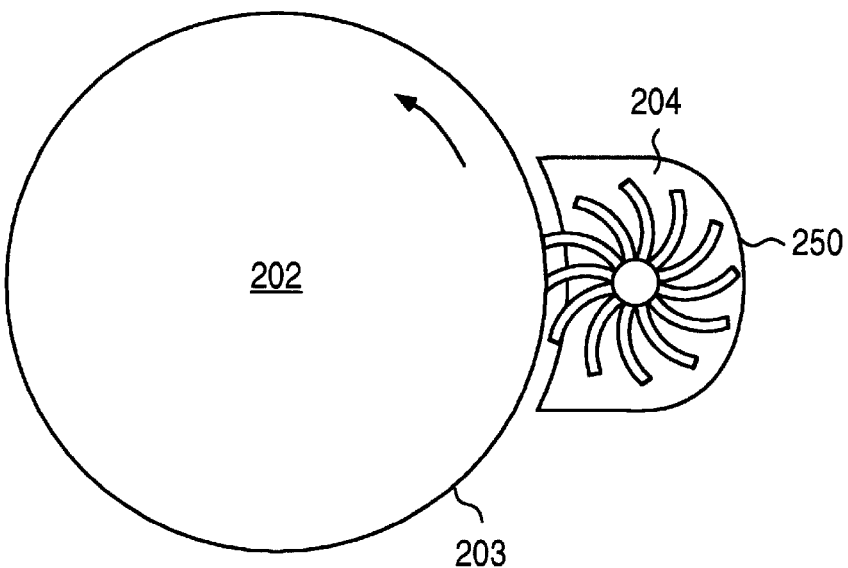
FIG. 4 illustrates another embodiment of the present invention wherein the flexible-leaf edge cleaning mechanism includes a splash shield.

In one embodiment, a splash shield 250 is provided around edge cleaning apparatus 204 to minimize the dispersion of water, chemicals and contaminates from the surface of leaves 208 to other areas of the scrubber system. (See FIG. 4.)

Another benefit of the present invention lies in the ability to use different types of materials to facilitate the cleaning of a variety of contaminates from the edge or bevel area of a wafer. Materials of different textures, stiffness, thickness, length, etc., may be used within a single edge cleaning device, or may be incorporated into a plurality of edge cleaning devices. In this manner, one material may be used for removing one type of contaminate while another material may be used to remove another type of contaminate.

Figure 5:
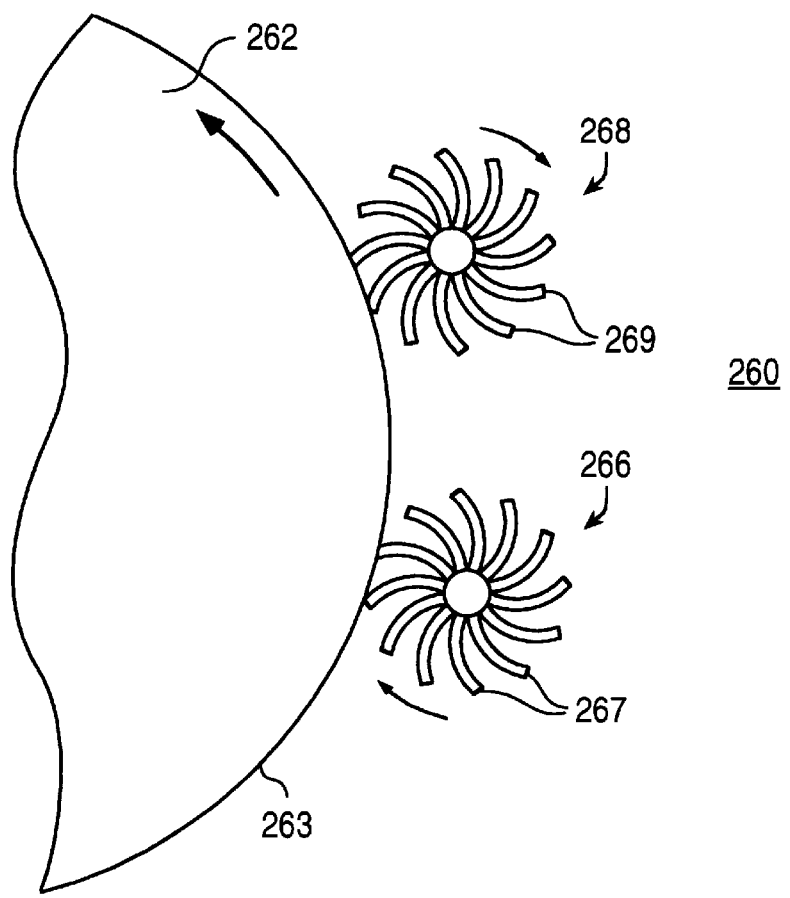
FIG. 5 illustrates another embodiment of the present invention wherein a plurality of flexible-leaf edge cleaning apparatus are used to clean the edge of a wafer.

FIG. 5 illustrates an embodiment of the present invention wherein a plurality of edge cleaning apparatus are used to sequentially clean an edge 263 of a wafer 262. As wafer 262 rotates, a first edge cleaning apparatus 266 containing a first plurality of leaves 267, of a given length, texture, stiffness, etc., cleans particles from edge 263. The edge of the wafer is then rotated toward a second cleaning apparatus 268 having leaves 269 that are made of a material different from leaves 267 of apparatus 266.

Figure 6:
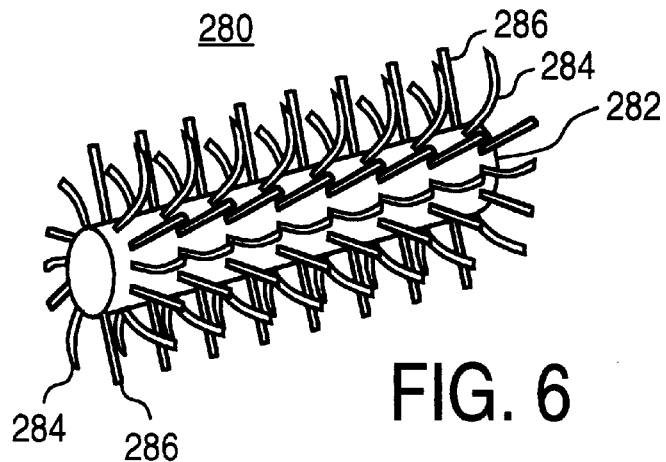
FIG. 6 illustrates a perspective view of an edge cleaning mechanism of the present invention containing a combination of flexible leaves and relatively stiff brush bristles.

FIG. 6 illustrates an edge cleaning apparatus 280 in another embodiment of the present invention. The apparatus includes a core 282 having a plurality of flexible leaves 284 and a plurality of rigid bristles 286 extending outward from the surface of the core. Leaves 284 and bristles 286 may be arranged in a staggered configuration, as depicted in FIG. 6, or may be arranged in a variety of other ways depending upon the particular cleaning requirements. The combined use of flexible leaves and relatively stiff bristles can, in some cases, enhance the particle removal capability of the edge cleaning apparatus.

Figure 7:
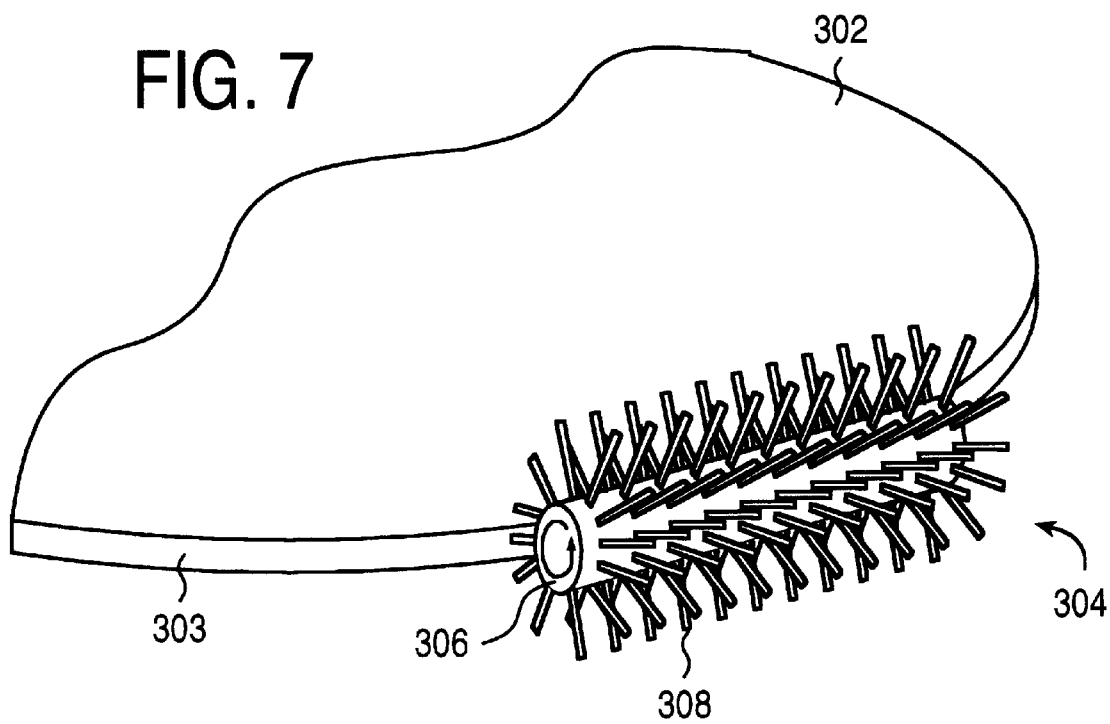
FIG. 7 illustrates an edge cleaning brush in accordance with another embodiment of the present invention.

FIG. 7 depicts a perspective view of another wafer edge cleaning device of the present invention. As shown in FIG. 7, an edge 303 of a wafer 302 is shown being cleaned by an edge cleaning brush 304 containing a plurality of bristles that extend outward from a brush core 306. The edge cleaning brush 306 of FIG. 7 differs from the edge cleaning apparatus of FIGS. 2A–6, in that particles are removed from the wafer edge primarily by the friction at the bristle 308 and edge 303 interface. Bristles 308 may comprise PVA, polyurethane, or urethane impregnated felt. Brush 306 is typically rotated at a rate of 60–100 rpm.

Thus, a method and apparatus for cleaning the edges of substrates, such as wafers, is disclosed.

We claim:

1. A scrubbing apparatus for cleaning a side edge of a substrate, said apparatus comprising:

a core having a first axis of rotation and an external surface, said external surface positioned a distance from said side edge;

a plurality of flexible leaves attached to said external surface of said core;

a motor coupled to said core for rotating said core about said first axis of rotation such that said flexible leaves impinge upon said side edge; and a support for holding said substrate, said support having a second axis of rotation that is oblique to said first axis of rotation.

2. The scrubbing apparatus of claim 1 wherein said distance between said external surface of said core and said substrate side edge is adjustable.

3. The scrubbing apparatus of claim 1 wherein said flexible leaves comprise Poly vinyl alcohol.

4. The scrubbing apparatus of claim 1 wherein said flexible leaves comprise nylon.

5. The scrubbing apparatus of claim 1 further comprising a plurality of bristles attached to said external surface of said core.

6. The scrubbing apparatus of claim 1 further comprising a roller that engages said side edge of said substrate.

7. The scrubbing apparatus of claim 1 further comprising a water jet propelling water at a point of contact between said flexible leaves and said substrate side edge.

8. The scrubbing apparatus of claim 7 further comprising a shield disposed around a portion of said water jet.

9. The scrubbing apparatus of claim 1 further comprising a jet propelling at least one chemical at a point of contact between said flexible leaves and said substrate side edge.

10. The scrubbing apparatus of claim 9 wherein said at least one chemical comprises $NH_4OH$.

11. An apparatus for cleaning a wafer edge, said apparatus positioned a proximal distance from said wafer edge and comprising:

a first roller that engages said wafer edge to rotate a wafer about a first axis of rotation;

a core having an external surface, the distance between said external surface of said core and said wafer edge being adjustable;

a plurality of fibers including flexible leaves extending from said external surface of said core for contacting said wafer edge; and a motor coupled to said core for rotating said core about a second axis of rotation, wherein said second axis of rotation is oblique to said first axis of rotation.

12. The apparatus of claim 11 wherein said plurality of fibers includes bristles.

13. The apparatus of claim 11 further comprising a water jet propelling water at a point of contact between said fibers and said wafer edge.

14. The apparatus of claim 13 further comprising a shield disposed around a portion of said water jet.

15. The apparatus of claim 11 further comprising a jet propelling at least one chemical at a point of contact between said fibers and said wafer edge.

16. The apparatus of claim 15 further comprising a shield disposed around a portion of said chemical jet.

* * * * *

UNITED STATES PATENT AND TRADEMARK OFFICE
CERTIFICATE OF CORRECTION

PATENT NO.    : 6,092,253
DATED         : July 25, 2000
INVENTOR(S)   : Moinpour et al It is certified that error appears in the above-identified patent and that said Letters Patent is hereby corrected as shown below:

In section [75] Inventors, delete "Monsour" and replace with --Mansour--.

Signed and Sealed this

Seventeenth Day of April, 2001

Attest:

NICHOLAS P. GODICI

*Attesting Officer*        *Acting Director of the United States Patent and Trademark Office*